(12) United States Patent
Amano et al.

(10) Patent No.: US 9,123,794 B2
(45) Date of Patent: Sep. 1, 2015

(54) DICING DIE BOND FILM

(71) Applicant: NITTO DENKO CORPORATION, Ibaraki-shi, Osaka (JP)

(72) Inventors: Yasuhiro Amano, Ibaraki (JP); Miki Morita, Ibaraki (JP); Yuta Kimura, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/072,684

(22) Filed: Nov. 5, 2013

(65) Prior Publication Data

US 2014/0057100 A1  Feb. 27, 2014

Related U.S. Application Data

(62) Division of application No. 13/227,674, filed on Sep. 8, 2011, now abandoned.

(30) Foreign Application Priority Data

Sep. 13, 2010  (JP) .................................. 2010-204487

(51) Int. Cl.
  *H01L 29/06* (2006.01)
  *H01L 21/78* (2006.01)
  (Continued)

(52) U.S. Cl.
  CPC ............... *H01L 21/78* (2013.01); *C09J 7/0203* (2013.01); *C09J 9/02* (2013.01); *H01L 21/67132* (2013.01); *H01L 21/6836* (2013.01); *H01L 24/29* (2013.01); *C08K 7/00* (2013.01);
  (Continued)

(58) Field of Classification Search
  CPC .. H01L 21/78; H01L 21/67132; C09J 7/0203; C09J 9/02
  USPC ......................................................... 257/622
  See application file for complete search history.

(56) References Cited

U.S. PATENT DOCUMENTS

| 5,043,102 A | 8/1991 | Chen et al. |
| 5,382,384 A | 1/1995 | Baigrie et al. |

(Continued)

FOREIGN PATENT DOCUMENTS

| CN | 101362926 | 2/2009 |
| JP | 2005-276925 | 10/2005 |

(Continued)

OTHER PUBLICATIONS

Office Action dated Dec. 17, 2013 in corresponding Japanese patent application No. 2010-204487.

(Continued)

*Primary Examiner* — David S Blum
(74) *Attorney, Agent, or Firm* — Knobbe Martens Olson and Bear, LLP (57) ABSTRACT

The present invention provides a dicing die bond film in which peeling electrification hardly occurs and which has good tackiness and workability. The dicing die bond film of the present invention is a dicing die bond film including a dicing film and a thermosetting type die bond film provided thereon, wherein the thermosetting type die bond film contains conductive particles, the volume resistivity of the thermosetting type die bond film is $1 \times 10^{-6}$ Ω·cm or more and $1 \times 10^{-3}$ Ω·cm or less, and the tensile storage modulus of the thermosetting type die bond film at −20° C. before thermal curing is 0.1 to 10 GPa.

7 Claims, 3 Drawing Sheets

(51) Int. Cl.
*C09J 7/02* (2006.01)
*C09J 9/02* (2006.01)
*H01L 21/67* (2006.01)
*H01L 23/00* (2006.01)
*H01L 21/683* (2006.01)
*C08K 7/00* (2006.01)
*H01L 23/31* (2006.01)
*H01L 25/065* (2006.01)

(52) U.S. Cl.
CPC ..... *C09J 2201/622* (2013.01); *C09J 2203/326* (2013.01); *C09J 2205/102* (2013.01); *H01L 23/3121* (2013.01); *H01L 24/32* (2013.01); *H01L 24/45* (2013.01); *H01L 24/48* (2013.01); *H01L 24/73* (2013.01); *H01L 24/85* (2013.01); *H01L 24/92* (2013.01); *H01L 25/0657* (2013.01); *H01L 2221/6834* (2013.01); *H01L 2221/68327* (2013.01); *H01L 2221/68336* (2013.01); *H01L 2221/68377* (2013.01); *H01L 2224/293* (2013.01); *H01L 2224/294* (2013.01); *H01L 2224/2919* (2013.01); *H01L 2224/2929* (2013.01); *H01L 2224/2939* (2013.01); *H01L 2224/29324* (2013.01); *H01L 2224/29339* (2013.01); *H01L 2224/29344* (2013.01); *H01L 2224/29347* (2013.01); *H01L 2224/29355* (2013.01); *H01L 2224/32145* (2013.01); *H01L 2224/32225* (2013.01); *H01L 2224/32245* (2013.01); *H01L 2224/45124* (2013.01); *H01L 2224/45144* (2013.01); *H01L 2224/45147* (2013.01); *H01L 2224/48091* (2013.01); *H01L 2224/48145* (2013.01); *H01L 2224/48227* (2013.01); *H01L 2224/48247* (2013.01); *H01L 2224/73265* (2013.01); *H01L 2224/85205* (2013.01); *H01L 2224/92247* (2013.01); *H01L 2924/0102* (2013.01); *H01L 2924/01005* (2013.01); *H01L 2924/01006* (2013.01); *H01L 2924/01012* (2013.01); *H01L 2924/01013* (2013.01); *H01L 2924/01014* (2013.01); *H01L 2924/01015* (2013.01); *H01L 2924/01019* (2013.01); *H01L 2924/01023* (2013.01); *H01L 2924/01028* (2013.01); *H01L 2924/01029* (2013.01); *H01L 2924/01033* (2013.01); *H01L 2924/01045* (2013.01); *H01L 2924/01047* (2013.01); *H01L 2924/01051* (2013.01); *H01L 2924/01057* (2013.01); *H01L 2924/01074* (2013.01); *H01L 2924/01077* (2013.01); *H01L 2924/01079* (2013.01); *H01L 2924/01082* (2013.01); *H01L 2924/0665* (2013.01); *H01L 2924/10253* (2013.01); *H01L 2924/15747* (2013.01); *H01L 2924/3025* (2013.01); *Y10T 428/25* (2015.01); *Y10T 428/28* (2015.01); *Y10T 428/2817* (2015.01)

(56) References Cited

U.S. PATENT DOCUMENTS

| | | |
|---|---|---|
| 5,399,637 A | 3/1995 | Willett et al. |
| 5,573,843 A | 11/1996 | Mitoh et al. |
| 5,667,899 A | 9/1997 | Yusa et al. |
| 5,863,970 A | 1/1999 | Ghoshal et al. |
| 6,242,513 B1 | 6/2001 | Zhou et al. |
| 6,406,988 B1 | 6/2002 | Chung |
| 6,465,330 B1 | 10/2002 | Takahashi et al. |
| 7,329,462 B2 | 2/2008 | Gallucci et al. |
| 7,737,001 B2 | 6/2010 | Abe et al. |
| 8,071,465 B2 | 12/2011 | Hatakeyama et al. |
| 2002/0127406 A1 | 9/2002 | Sachdev et al. |
| 2002/0175316 A1 | 11/2002 | Shimizu et al. |
| 2003/0122257 A1 | 7/2003 | Onami et al. |
| 2003/0216505 A1 | 11/2003 | Akiba et al. |
| 2004/0191501 A1 | 9/2004 | Rasiah |
| 2005/0179127 A1 | 8/2005 | Takyu et al. |
| 2006/0128065 A1 | 6/2006 | Inada et al. |
| 2006/0194920 A1 | 8/2006 | Capote et al. |
| 2006/0197260 A1 | 9/2006 | Yoshikawa et al. |
| 2008/0166543 A1 | 7/2008 | Zhuo |
| 2008/0171187 A1 | 7/2008 | Inada et al. |
| 2008/0171824 A1 | 7/2008 | Cieslinski et al. |
| 2008/0286594 A1 | 11/2008 | Inada et al. |
| 2008/0305583 A1 | 12/2008 | Inada et al. |
| 2009/0071703 A1 | 3/2009 | Imahori et al. |
| 2009/0186216 A1 | 7/2009 | Inada et al. |
| 2010/0081258 A1 | 4/2010 | Takamoto |
| 2010/0093154 A1 | 4/2010 | Amano et al. |
| 2010/0099221 A1 | 4/2010 | Nakamura |
| 2010/0311227 A1 | 12/2010 | Hatakeyama et al. |
| 2011/0210455 A1 | 9/2011 | Oonishi et al. |
| 2011/0315916 A1 | 12/2011 | Wilson et al. |
| 2012/0126380 A1 | 5/2012 | Uenda et al. |
| 2012/0295416 A1 | 11/2012 | Kimura et al. |
| 2013/0045585 A1 | 2/2013 | Inada et al. |

FOREIGN PATENT DOCUMENTS

| | | |
|---|---|---|
| JP | 2006-225566 | 8/2006 |
| JP | 2008-218571 | 9/2008 |
| JP | 2009-212290 | 9/2009 |
| JP | 2010-001330 | 1/2010 |
| WO | WO 2004/109786 | 12/2004 |
| WO | WO 2008/108131 | 9/2008 |

OTHER PUBLICATIONS

Notification of First Office Action dated Feb. 28, 2014 in corresponding Chinese patent application No. 201110276396.6.
Chinese Office Action dated Aug. 27, 2014 in corresponding to Chinese Patent Application No. 201110276306.6.

DICING DIE BOND FILM

BACKGROUND OF THE INVENTION

1. Field of the Invention

The present invention also relates to a dicing die bond film.

2. Description of the Related Art

Conventionally, a dicing die bond film including a dicing film and a thermosetting type die bond film laminated thereon is used in a process of manufacturing a semiconductor device (refer to Japanese Patent Application Laid-Open No. 2008-218571, for example). In the process of manufacturing a semiconductor device using this dicing die bond film, first, a semiconductor wafer is pasted and fixed to the dicing die bond film, and dicing is performed in this state. With this operation, the semiconductor wafer is processed into individual pieces having a prescribed size, which serves as semiconductor chips. Next, pickup of a semiconductor chip is performed to peel the semiconductor chip fixed to the dicing die bond film from the dicing film.

In the pickup step, when the semiconductor chip with a die bond film is peeled from the dicing film, peeling electrification occurs between the die bond film and the dicing film. Because of that, there has been a problem that a circuit on the semiconductor chip is broken by the generated static electricity.

Because of that, development of a die bond film has been desired, that has functions such as tackiness and workability as in a conventional die bond film and also an antistatic function.

SUMMARY OF THE INVENTION

The present invention has been made in view of the above-described problems, and an object thereof is to provide a dicing die bond film in which peeling electrification hardly occurs and which has good tackiness and workability.

The present inventors investigated a dicing die bond film including a die bond film and a dicing film laminated thereon to solve the above-described conventional problems. As a result, they found that the peeling electrification hardly occurs and good tackiness and workability of the die bond film can be obtained by making the volume resistivity of the thermosetting type die bond film $1 \times 10^{-6}$ Ω·cm or more and $1 \times 10^{-3}$ Ω·cm or less by incorporating conductive particles into the thermosetting type die bond film and by making the tensile storage modulus of the thermosetting type die bond film at −20° C. before thermal curing 0.1 to 10 GPa, and completed the present invention.

The dicing die bond film according to the present invention is a dicing die bond film including a dicing film and a thermosetting type die bond film provided thereon, and is characterized in that the thermosetting type die bond film contains conductive particles, the volume resistivity of the thermosetting type die bond film is $1 \times 10^{-6}$ Ω·cm or more and $1 \times 10^{-3}$ Ω·cm or less, and the tensile storage modulus of the thermosetting type die bond film at −20° C. before thermal curing is 0.1 to 10 GPa.

According to the above-described configuration, because the volume resistivity of the thermosetting type die bond film is $1 \times 10^{-3}$ Ω·cm or less, a high antistatic effect can be exhibited. Therefore, breakage of the semiconductor chip due to peeling electrification during pickup can be prevented, and electrification when the semiconductor chip with a die bond film is laminated on an adherend can be prevented. As a result, reliability as a device can be improved.

Because the tensile storage modulus of the thermosetting type die bond film at −20° C. before thermal curing is 10 GPa or less, good tackiness to the adherend and good workability can be obtained. Because the tensile storage modulus is 0.1 GPa or more and relatively high, stress can be easily transferred during expansion.

The "volume resistivity" in the present invention is a value measured by a four-point probe method according to JIS K 7194.

In the above-described configuration, the conductive particles are two kinds or more of conductive particles having different average particle sizes, and each kind of the conductive particles preferably has an average particle size of 0.01 μm or more and 10 μm or less. By making the average particle size of the conductive particles 0.01 μm or more, wettability to the adherend can be secured and good tackiness can be exhibited. By making the average particle size of the conductive particles 10 μm or less, a better improvement effect on electrical conductivity and thermal conductivity due to the addition of the conductive particles can be obtained. Further, the thickness of the thermosetting type die bond film can be reduced, high integration can be made possible, and generation of a chip crack caused by projection of the conductive particles from the thermosetting type die bond film can be prevented. Further, by using two kinds of more of the conductive particles having different average particle sizes, the filling factor can be easily improved.

In the above-described configuration, the content of the conductive particles is preferably 20 to 90 parts by weight relative to 100 parts by weight of an organic component of the thermosetting type die bond film. By making the content of the conductive particles 20 parts by weight or more, a decrease of the conductive function caused by a high volume resistivity due to the formation of a conductive path can be suppressed. By making the content of the conductive particles 90 parts by weight or less, good toughness of the thermosetting type die bond film can be kept and generation of cracks and chipping during handling of the thermosetting type die bond film can be prevented.

In the above-described configuration, a semiconductor chip with a die bond film is formed by forming a modified region on a semiconductor wafer by irradiating the semiconductor wafer with a laser beam, pasting the semiconductor wafer to the dicing die bond film, and breaking the semiconductor wafer at the modified region and simultaneously breaking the thermosetting type die bond film that configures the dicing die bond film at a position that corresponds to the modified region by applying a tensile force to the dicing die bond film. The obtained semiconductor chip with the die bond film is peeled from the dicing film. The peeled semiconductor chip with the die bond film is preferably used in a method of fixing the peeled semiconductor chip with the die bond film to an adherend with the die bond film interposed therebetween. The above-described method is a method by which generation of defects such as chipping that occurs especially when the semiconductor wafer is thin can be reduced. The volume resistivity of the thermosetting type die bond film is $1 \times 10^{-3}$ Ω·cm or less. Therefore, a high antistatic effect can be exhibited even when the thermosetting type die bond film is used in the above-described method. Because the tensile storage modulus of the thermosetting type die bond film at −20° C. before thermal curing is 0.1 to 10 GPa, generation of chipping when the semiconductor wafer is broken at the modified region can be prevented. Further, chip fly and positional deviation of the semiconductor chip during pickup thereof can be prevented.

In the above-described configuration, a semiconductor chip with a die bond film is formed by forming grooves on a surface of a semiconductor wafer, exposing the grooves by performing backside grinding, pasting the dicing die bond film to the surface of the semiconductor wafer where the grooves are exposed, and breaking the thermosetting type die bond film that configures the dicing die bond film at a position that corresponds to the grooves by applying a tensile force to the dicing die bond film. The obtained semiconductor chip with the die bond film is peeled from the dicing film. The peeled semiconductor chip with the die bond film is preferably used in a method of fixing the peeled semiconductor chip with the die bond film to an adherend with the die bond film interposed therebetween. The above-described method is a method by which generation of defects such as chipping that occurs especially when the semiconductor wafer is thin can be reduced. The volume resistivity of the thermosetting type die bond film is $1 \times 10^{-3}$ Ω·cm or less. Therefore, a high antistatic effect can be exhibited even when the thermosetting type die bond film is used in the above-described method. Because the tensile storage modulus of the thermosetting type die bond film at −20° C. before thermal curing is 0.1 to 10 GPa, chip fly and positional deviation of the semiconductor chip during pickup thereof can be prevented.

In the above-described configuration, the conductive particles are preferably of at least one kind selected from the group consisting of nickel particles, copper particles, silver particles, aluminum particles, carbon black, carbon nanotubes, metal particles obtained by plating a surface of a metal with another metal, and resin particles of which surface is coated with a metal.

In the above-described configuration, the thermosetting type die bond film preferably contains an acrylic resin as a thermoplastic resin.

DESCRIPTION OF THE REFERENCE NUMERALS

1 base
2 pressure-sensitive adhesive layer
3, 3' die bond film (thermosetting type die bond film)
4 semiconductor wafer
5 semiconductor chip
6 adherend
7 bonding wire
8 sealing resin
10, 12 dicing die bond film
11 dicing film

DESCRIPTION OF THE EMBODIMENTS (Dicing Die Bond Film)

Figure 1:
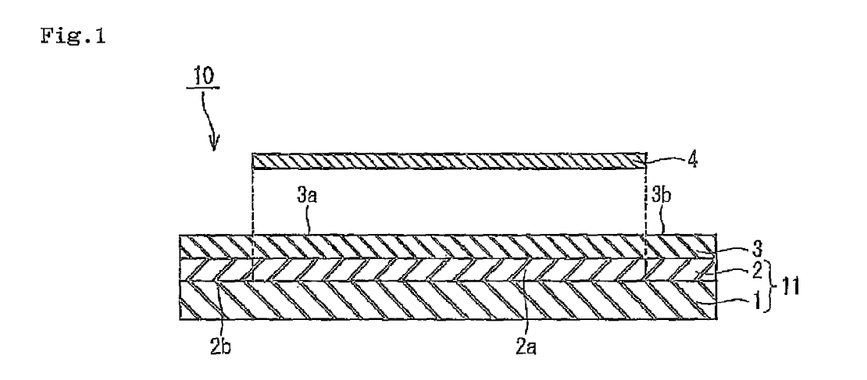
FIG. 1 is a schematic sectional view showing a dicing die bond film according to one embodiment of the present invention.
Figure 2:
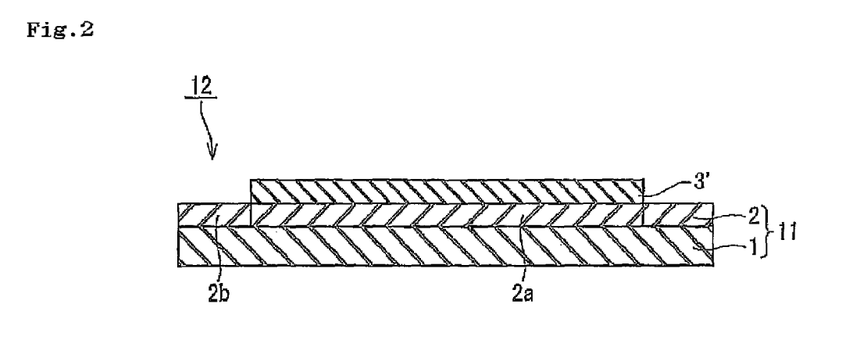
FIG. 2 is a schematic sectional view showing a dicing die bond film according to another embodiment of the present invention.

The dicing die bond film according to one embodiment of the present invention is explained below. FIG. 1 is a schematic sectional view showing a dicing die bond film according to one embodiment of the present invention. FIG. 2 is a schematic sectional view showing a dicing die bond film according to another embodiment of the present invention.

As shown in FIG. 1, a dicing die bond film 10 has a constitution in which a die bond film 3 is layered on a dicing film 11. The dicing film 11 is constituted by layering a pressure-sensitive adhesive layer 2 on a base material 1, and the die bond film 3 is provided on the adhesive layer 2. As shown in FIG. 2, the present invention may have a constitution such that a die bond film 3' is formed only at the portion to which workpieces are laminated.

The base 1 has ultraviolet transparency and is a base body for strength of dicing die bond films 10 and 12. Examples thereof include polyolefin such as low-density polyethylene, straight chain polyethylene, intermediate-density polyethylene, high-density polyethylene, very low-density polyethylene, random copolymer polypropylene, block copolymer polypropylene, homopolypropylene, polybutene, and polymethylpentene; an ethylene-vinylacetate copolymer; an ionomer resin; an ethylene(meth)acrylic acid copolymer; an ethylene(meth)acrylic acid ester (random or alternating) copolymer; an ethylene-butene copolymer; an ethylene-hexene copolymer; polyurethane; polyester such as polyethyleneterephthalate and polyethylenenaphthalate; polycarbonate; polyetheretherketone; polyimide; polyetherimide; polyamide; whole aromatic polyamides; polyphenylsulfide; aramid (paper); glass; glass cloth; a fluorine resin; polyvinyl chloride; polyvinylidene chloride; a cellulose resin; a silicone resin; metal (foil); and paper.

Further, the material of the base material 1 includes a polymer such as a cross-linked body of the above resins. The above plastic film may be also used unstreched, or may be also used on which a monoaxial or a biaxial stretching treatment is performed depending on necessity. According to resin sheets in which heat shrinkable properties are given by the stretching treatment, etc., the adhesive area of the pressure-sensitive adhesive layer 2 and the die bond films 3, 3' is reduced by thermally shrinking the base material 1 after dicing, and the recovery of the semiconductor chips (a semiconductor element) can be facilitated.

A known surface treatment such as a chemical or physical treatment such as a chromate treatment, ozone exposure, flame exposure, high voltage electric exposure, and an ionized ultraviolet treatment, and a coating treatment by an undercoating agent (for example, a tacky substance described later) can be performed on the surface of the base material 1 in order to improve adhesiveness, holding properties, etc. with the adjacent layer. The same type or different type of base material can be appropriately selected and used as the base material 1, and a base material in which a plurality of types are blended can be used depending on necessity.

The thickness of the base material 1 can be appropriately decided without limitation particularly. However, it is generally about 5 to 200 µm.

The pressure-sensitive adhesive used in the formation of a pressure-sensitive adhesive layer 2 is not especially limited, and examples thereof include general pressure-sensitive adhesives such as an acrylic pressure-sensitive adhesive and a rubber pressure-sensitive adhesive. The pressure-sensitive adhesive is preferably an acrylic pressure-sensitive adhesive containing an acrylic polymer as a base polymer in view of clean washing of electronic components such as a semiconductor wafer and glass, which are easily damaged by contamination, with ultrapure water or an organic solvent such as alcohol.

Specific examples of the acryl polymers include an acryl polymer in which acrylate is used as a main monomer component. Examples of the acrylate include alkyl acrylate (for example, a straight chain or branched chain alkyl ester having 1 to 30 carbon atoms, and particularly 4 to 18 carbon atoms in the alkyl group such as methylester, ethylester, propylester, isopropylester, butylester, isobutylester, sec-butylester, t-butylester, pentylester, isopentylester, hexylester, heptylester, octylester, 2-ethylhexylester, isooctylester, nonylester, decylester, isodecylester, undecylester, dodecylester, tridecylester, tetradecylester, hexadecylester, octadecylester, and eicosylester) and cycloalkyl acrylate (for example, cyclopentylester, cyclohexylester, etc.). These monomers may be used alone or two or more types may be used in combination. All of the words including "(meth)" in connection with the present invention have an equivalent meaning.

The acrylic polymer may optionally contain a unit corresponding to a different monomer component copolymerizable with the above-mentioned alkyl ester of (meth)acrylic acid or cycloalkyl ester thereof in order to improve the cohesive force, heat resistance or some other property of the polymer. Examples of such a monomer component include carboxyl-containing monomers such as acrylic acid, methacrylic acid, carboxyethyl(meth)acrylate, carboxypentyl(meth)acrylate, itaconic acid, maleic acid, fumaric acid, and crotonic acid; acid anhydride monomers such as maleic anhydride, and itaconic anhydride; hydroxyl-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate, and (4-hydroxylmethylcyclohexyl)methyl(meth)acrylate; sulfonic acid group containing monomers such as styrenesulfonic acid, allylsulfonic acid, 2-(meth)acrylamide-2-methylpropanesulfonic acid, (meth)acrylamidepropanesulfonic acid, sulfopropyl(meth)acrylate, and (meth)acryloyloxynaphthalenesulfonic acid; phosphoric acid group containing monomers such as 2-hydroxyethylacryloyl phosphate; acrylamide; and acrylonitrile. These copolymerizable monomer components may be used alone or in combination of two or more thereof. The amount of the copolymerizable monomer(s) to be used is preferably 40% or less by weight of all the monomer components.

For crosslinking, the acrylic polymer can also contain multifunctional monomers if necessary as the copolymerizable monomer component. Such multifunctional monomers include hexane diol di(meth)acrylate, (poly)ethylene glycol di(meth)acrylate, (poly)propylene glycol di(meth)acrylate, neopentyl glycol di(meth)acrylate, pentaerythritol di(meth)acrylate, trimethylol propane tri(meth)acrylate, pentaerythritol tri(meth)acrylate, dipentaerythritol hexa(meth)acrylate, epoxy(meth)acrylate, polyester(meth)acrylate, urethane (meth)acrylate etc. These multifunctional monomers can also be used as a mixture of one or more thereof. From the viewpoint of adhesiveness etc., the use amount of the multifunctional monomer is preferably 30 wt % or less based on the whole monomer components.

Preparation of the above acryl polymer can be performed by applying an appropriate manner such as a solution polymerization manner, an emulsion polymerization manner, a bulk polymerization manner, and a suspension polymerization manner to a mixture of one or two or more kinds of component monomers for example. Since the pressure-sensitive adhesive layer preferably has a composition in which the content of low molecular weight materials is suppressed from the viewpoint of prevention of wafer contamination, and since those in which an acryl polymer having a weight average molecular weight of 300000 or more, particularly 400000 to 30000000 is as a main component are preferable from such viewpoint, the pressure-sensitive adhesive can be made to be an appropriate cross-linking type with an internal cross-linking manner, an external cross-linking manner, etc.

To increase the number-average molecular weight of the base polymer such as acrylic polymer etc., an external crosslinking agent can be suitably adopted in the pressure-sensitive adhesive. The external crosslinking method is specifically a reaction method that involves adding and reacting a crosslinking agent such as a polyisocyanate compound, epoxy compound, aziridine compound, melamine crosslinking agent, urea resin, anhydrous compound, polyamine, carboxyl group-containing polymer. When the external crosslinking agent is used, the amount of the crosslinking agent to be used is determined suitably depending on balance with the base polymer to be crosslinked and applications thereof as the pressure-sensitive adhesive. Generally, the crosslinking agent is preferably incorporated in an amount of about 5 parts by weight or less based on 100 parts by weight of the base polymer. The lower limit of the crosslinking agent is preferably 0.1 parts by weight or more. The pressure-sensitive adhesive may be blended not only with the components described above but also with a wide variety of conventionally known additives such as a tackifier, and aging inhibitor, if necessary.

The pressure-sensitive adhesive layer 2 can be formed with a radiation curing-type pressure-sensitive adhesive. The radiation curing-type pressure-sensitive adhesive can easily decrease its adhesive power by increasing the degree of crosslinking by irradiation with radiation such as an ultraviolet ray, and by irradiating only a portion 2a that corresponds to a workpiece pasting portion of the pressure-sensitive adhesive layer 2 shown in FIG. 2 with radiation, a difference in adhesive power from that of a different portion 2b can be provided.

Further, by curing the radiation curing-type pressure-sensitive adhesive layer 2 with the die bond film 3' shown in FIG. 2, the part 2a in which the adhesive strength is remarkably decreased can be formed easily. Because the die bond film 3' is pasted to the part 2a in which the adhesive strength is decreased by curing, the interface of the part 2a of the pressure-sensitive adhesive layer 2 and the die bond film 3' has a characteristic of being easily peeled during pickup. On the other hand, the part not radiated by radiation has sufficient adhesive strength, and forms the part 2b.

As described above, in the pressure-sensitive adhesive layer 2 of the dicing die bond film 10 shown in FIG. 1, the part 2b formed by a non-cured radiation curing-type pressure-sensitive adhesive sticks to the die bond film 3, and the holding force when dicing can be secured. In such a manner, the radiation curing-type pressure-sensitive adhesive can support the die bond film 3 for fixing a chip-shaped workpiece such as a semiconductor chip to an adherend such as a substrate with a good balance between adhesion and peeling. In the pressure-sensitive adhesive layer 2 of the dicing die bond film 11 shown in FIG. 2, a dicing ring can be fixed to the part 2b.

The radiation curing-type pressure-sensitive adhesive that is used has a radiation curable functional group of a radical reactive carbon-carbon double bond, etc., and adherability. Examples of the radiation curing-type pressure-sensitive adhesive are an added type radiation curing-type pressure-sensitive adhesive in which a radiation curable monomer component or an oligomer component is compounded into an acryl pressure sensitive adhesive or a rubber pressure sensitive adhesive.

Examples of the radiation curable monomer component to be compounded include such as an urethane oligomer, urethane(meth)acrylate, trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxypenta(meth)acrylate, dipentaerythritol hexa(meth)acrylate, and 1,4-butane dioldi(meth)acrylate. Further, the radiation curable oligomer component includes various types of oligomers such as an urethane based, a polyether based, a polyester based, a polycarbonate based, and a polybutadiene based oligomer, and its molecular weight is appropriately in a range of about 100 to 30,000. The compounding amount of the radiation curable monomer component and the oligomer component can be appropriately determined to an amount in which the adhesive strength of the pressure-sensitive adhesive layer can be decreased depending on the type of the pressure-sensitive adhesive layer. Generally, it is for example 5 to 500 parts by weight, and preferably about 40 to 150 parts by weight based on 100 parts by weight of the base polymer such as an acryl polymer constituting the pressure sensitive adhesive.

Further, besides the added type radiation curing-type pressure-sensitive adhesive described above, the radiation curing-type pressure-sensitive adhesive includes an internal radiation curing-type pressure-sensitive adhesive using an acryl polymer having a radical reactive carbon-carbon double bond in the polymer side chain, in the main chain, or at the end of the main chain as the base polymer. The internal radiation curing-type pressure-sensitive adhesives of an internally provided type are preferable because they do not have to contain the oligomer component, etc. that is a low molecular weight component, or most of them do not contain, they can form a pressure-sensitive adhesive layer having a stable layer structure without migrating the oligomer component, etc. in the pressure sensitive adhesive over time.

The above-mentioned base polymer, which has a carbon-carbon double bond, may be any polymer that has a carbon-carbon double bond and further has viscosity. As such a base polymer, a polymer having an acrylic polymer as a basic skeleton is preferable. Examples of the basic skeleton of the acrylic polymer include the acrylic polymers exemplified above.

The method for introducing a carbon-carbon double bond into any one of the above-mentioned acrylic polymers is not particularly limited, and may be selected from various methods. The introduction of the carbon-carbon double bond into a side chain of the polymer is easier in molecule design. The method is, for example, a method of copolymerizing a monomer having a functional group with an acrylic polymer, and then causing the resultant to condensation-react or addition-react with a compound having a functional group reactive with the above-mentioned functional group and a carbon-carbon double bond while keeping the radial ray curability of the carbon-carbon double bond.

Examples of the combination of these functional groups include a carboxylic acid group and an epoxy group; a carboxylic acid group and an aziridine group; and a hydroxyl group and an isocyanate group. Of these combinations, the combination of a hydroxyl group and an isocyanate group is preferable from the viewpoint of the easiness of reaction tracing. If the above-mentioned acrylic polymer, which has a carbon-carbon double bond, can be produced by the combination of these functional groups, each of the functional groups may be present on any one of the acrylic polymer and the above-mentioned compound. It is preferable for the above-mentioned preferable combination that the acrylic polymer has the hydroxyl group and the above-mentioned compound has the isocyanate group. Examples of the isocyanate compound in this case, which has a carbon-carbon double bond, include methacryloyl isocyanate, 2-methacryloyloxyethyl isocyanate, and m-isopropenyl-α,α-dimethylbenzyl isocyanate. The used acrylic polymer may be an acrylic polymer copolymerized with anyone of the hydroxyl-containing monomers exemplified above, or an ether compound such as 2-hydroxyethyl vinyl ether, 4-hydroxybutyl vinyl ether or diethylene glycol monovinyl ether.

The internal radiation curing-type pressure-sensitive adhesive may be made only of the above-mentioned base polymer (in particular, the acrylic polymer), which has a carbon-carbon double bond. However, the above-mentioned radiation curable monomer component or oligomer component may be incorporated into the base polymer to such an extent that properties of the adhesive are not deteriorated. The amount of the radiation curable oligomer component or the like is usually 30 parts or less by weight, preferably from 0 to 10 parts by weight for 100 parts by weight of the base polymer.

In the case that the radiation curable adhesive is cured with ultraviolet or the like, a photopolymerization initiator is incorporated into the adhesive. Examples of the photopolymerization initiator include α-ketol compounds such as 4-(2-hydroxyethoxy)phenyl(2-hydroxy-2-propyl)ketone, α-hydroxy-α,α'-dimethylacetophenone, 2-methyl-2-hydroxypropiophenone, and 1-hydroxycyclohexyl phenyl ketone; acetophenone compounds such as methoxyacetophenone, 2,2-dimethoxy-2-phenylacetophenone, 2,2-diethoxyacetophenone, and 2-methyl-1-[4-(methylthio)-phenyl]-2-morpholinopropane-1; benzoin ether compounds such as benzoin ethyl ether, benzoin isopropyl ether, and anisoin methyl ether; ketal compounds such as benzyl dimethyl ketal; aromatic sulfonyl chloride compounds such as 2-naphthalenesulfonyl chloride; optically active oxime compounds such as 1-phenone-1,1-propanedione-2-(o-ethoxycarbonyl) oxime; benzophenone compounds such as benzophenone, benzoylbenzoic acid, and 3,3'-dimethyl-4-methoxybenzophenone; thioxanthone compound such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphorquinone; halogenated ketones; acylphosphonoxides; and acylphosphonates. The amount of the photopolymerization initiator to be blended is, for example, from about 0.05 to 20 parts by weight for 100 parts by weight of the acrylic polymer or the like which constitutes the adhesive as a base polymer.

Further, examples of the radiation curing-type pressure-sensitive adhesive which is used in the formation of the pressure-sensitive adhesive layer 2 include such as a rubber pressure-sensitive adhesive or an acryl pressure-sensitive adhesive which contains an addition-polymerizable compound having two or more unsaturated bonds, a photopolymerizable compound such as alkoxysilane having an epoxy group, and a photopolymerization initiator such as a carbonyl compound, an organic sulfur compound, a peroxide, an amine, and an onium salt compound, which are disclosed in JP-A No. 60-196956. Examples of the above addition-polymerizable compound having two or more unsaturated bonds include such as polyvalent alcohol ester or oligoester of acryl acid or methacrylic acid and an epoxy or a urethane compound.

The radiation curing-type pressure-sensitive adhesive layer 2 can contain a compound that colors by irradiation with a radiation as necessary. By containing the compound that colors by irradiation with a radiation in the pressure-sensitive adhesive layer 2, only the portion irradiated with a radiation can be colored. The portion 2a that corresponds to a workpiece pasting portion 3a shown in FIG. 1 can be colored. Accordingly, whether the pressure-sensitive adhesive layer 2 is irradiated with a radiation or not can be visually determined immediately, and the workpiece pasting portion 3a can be recognized easily, and the pasting of the work piece is easy. Further, when detecting a semiconductor chip with a photosensor or the like, the detection accuracy improves, and no incorrect operation occurs during pickup of the semiconductor chip.

The compound that colors by irradiation with a radiation is colorless or has a pale color before the irradiation with a radiation. However, it is colored by irradiation with a radiation. A preferred specific example of the compound is a leuco dye. Common leuco dyes such as triphenylmethane, fluoran, phenothiazine, auramine, and spiropyran can be preferably used. Specific examples thereof include 3-[N-(p-tolylamino)]-7-anilinofluoran, 3-[N-(p-tolyl)-N-methylamino]-7-anilinofluoran, 3-[N-(p-tolyl)-N-ethylamino]-7-anilinofluoran, 3-diethylamino-6-methyl-7-anilinofluoran, crystal violet lactone, 4,4',4''-trisdimethylaminotriphenylmethanol, and 4,4',4''-trisdimethylaminotriphenylmethane.

Examples of a developer that is preferably used with these leuco dyes include a prepolymer of a conventionally known phenolformalin resin, an aromatic carboxylic acid derivative, and an electron acceptor such as activated white earth, and various publicly known color developers can be used in combination for changing the color tone.

The compound that colors by irradiation with a radiation may be included in the radiation curing-type pressure-sensitive adhesive after it is dissolved in an organic solvent or the like, or may be included in the pressure-sensitive adhesive in the form of a fine powder. The ratio of use of this compound is 10% by weight or less, preferably 0.01 to 10% by weight, and more preferably 0.5 to 5% by weight in the pressure-sensitive adhesive layer 2. When the ratio of the compound exceeds 10% by weight, the curing of the portion 2a of the pressure-sensitive adhesive layer 2 becomes insufficient because the radiation that is radiated onto the pressure-sensitive adhesive layer 2 is absorbed too much by this compound, and the adhesive power may not decrease sufficiently. On the other hand, the ratio of the compound is preferably 0.01% by weight or more to color the compound sufficiently.

When the pressure-sensitive adhesive layer 2 is formed with the radiation curing-type pressure-sensitive adhesive, a portion of the pressure-sensitive adhesive layer 2 may be irradiated with radiation so that the adhesive power of the portion 2a of the pressure-sensitive adhesive layer 2 becomes smaller than the adhesive power of the different portion 2b.

An example of the method of forming the portion 2a on the pressure-sensitive adhesive layer 2 is a method of forming the radiation curing-type pressure-sensitive adhesive layer 2 on the support base 1 and then curing the radiation curing-type pressure-sensitive adhesive layer 2 by partially irradiating the portion 2a with radiation. The partial irradiation with radiation can be performed through a photo mask in which a pattern is formed corresponding to the portion 3b or the like other than the workpiece pasting portion 3a. Another example is a method of curing the radiation curing-type pressure-sensitive adhesive layer 2 by spot irradiation with an ultraviolet ray. The radiation curing-type pressure-sensitive adhesive layer 2 can be formed by transferring a layer provided on a separator onto the support base 1. The partial curing with radiation can also be performed on the radiation curing-type pressure-sensitive adhesive layer 2 provided on the separator.

When the pressure-sensitive adhesive layer 2 is formed with a radiation curing-type pressure-sensitive adhesive, the portion 2a in which the adhesive power is decreased can be formed by using the support base 1 in which the entirety or a part of a portion other than the portion that corresponds to the workpiece pasting portion 3a of at least one side of the support base 1 is shielded, forming the radiation curing-type pressure-sensitive adhesive layer 2 on this support base 1 to cure the portion that corresponds to the workpiece pasting portion 3a by irradiation with radiation. The shielding material that can serve as a photo mask on a support film can be produced by printing, vapor deposition, or the like. According to such a manufacturing method, the dicing die bond film 10 of the present invention can be manufactured efficiently.

When curing hindrance by oxygen occurs during irradiation with radiation, it is desirable to block oxygen (air) from the surface of the radiation curing-type pressure-sensitive adhesive layer 2 by some method. Examples of the method include a method of covering the surface of the pressure-sensitive adhesive layer 2 with a separator and a method of performing irradiation with an ultraviolet ray in a nitrogen gas atmosphere.

The thickness of the pressure-sensitive adhesive layer 2 is not particularly limited. However, it is preferably about 1 to 50 µm from the viewpoint of preventing chipping of the chip cut surface, compatibility of fixing and holding of the adhesive layer, and the like. It is preferably 2 to 30 µm, and further preferably 5 to 25 µm.

Conductive particles are contained in the die bond films 3 and 3'. The conductive particles are preferably of at least one kind selected from the group consisting of nickel particles, copper particles, silver particles, aluminum particles, carbon black, carbon nanotubes, metal particles obtained by plating a surface of a metal with another metal, and resin particles of which surface is coated with a metal.

The metal particles obtained by plating a surface of a metal with another metal are not especially limited. For example, it is possible to use particles obtained by coating nickel particles or copper particles as a core with a noble metal such as gold or silver. The resin particles of which surface is coated with a metal are not especially limited. For example, it is possible to use particles obtained by plating non-conductive particles of a resin, an inorganic compound, or the like with a metal such as nickel or gold.

The shape of the conductive particles is not especially limited, and examples thereof include a flake shape, a needle shape, a filament shape, a spherical shape, and a scale shape. However, a spherical shape is preferable in view of improving dispersibility and filling factor.

The average particle size of the conductive particles is preferably 0.01 µm or more and 10 µm or less, and more preferably 0.1 µm or more and 10 µm or less. By making the average particle size of the conductive particles 0.01 µm or more, wettability to the adherend can be secured and good tackiness can be exhibited, and by making the average particle size 10 µm or less, a better improvement effect on electrical conductivity and thermal conductivity due to the addition of the conductive particles can be obtained. The average particle size of the conductive particles is a value obtained by an optical particle size distribution meter (device name: LA-910 manufactured by HORIBA, Ltd.), for example.

The conductive particles are preferably two kinds or more of particles having different average particle sizes. By using two kinds or more of particles having different particle sizes, the filling factor can be easily improved. When two kinds or more of conductive particles having different average particle sizes are incorporated, a system is preferable in which conductive particles A having an average particle size of 0.01 μm or more and less than 5 μm and conductive particles B having an average particle size of 1 μm or more and 10 μm or less are mixed together. In this case, the mixing ratio of conductive particles A to conductive particles B is preferably 1:9 to 4:6 in a weight ratio.

The content of the conductive particles is preferably 20 to 90 parts by weight and more preferably 40 to 90 parts by weight relative to 100 parts by weight of an organic component of the die bond films 3 and 3'. By making the content of the conductive particles 20 parts by weight or more, a decrease of the conductive function caused by a high volume resistivity due to the formation of a conductive path can be suppressed. By making the content of the conductive particles 90 parts by weight or less, good toughness of the thermosetting type die bond film can be kept and generation of cracks and chipping during handling of the thermosetting type die bond film can be prevented.

The volume resistivity of the die bond films 3 and 3' is $1\times10^{-6}$ Ω·cm or more and $1\times10^{-3}$ Ω·cm or less. The volume resistivity is preferably $1\times10^{-6}$ Ω·cm or more and $1\times10^{-5}$ Ω·cm or less, and more preferably $1\times10^{-6}$ Ω·cm or more and $1\times10^{-4}$ Ω·cm or less. Because the volume resistivity of the thermosetting type die bond films 3 and 3' is $1\times10^{-3}$ Ω·cm or less, a high antistatic effect can be exhibited. As a result, breakage of the semiconductor chip due to peeling electrification during pickup can be prevented, and reliability as a device can be improved.

The tensile storage modulus of the die bond films 3 and 3' at −20° C. before thermal curing is 0.1 to 10 GPa, preferably 1 to 10 GPa, and more preferably 4 to 10 GPa. Because the tensile storage modulus of the die bond films 3 and 3' at −20° C. before thermal curing is 10 GPa or less, good tackiness to the adherend and good workability can be obtained. Because the tensile storage modulus is 0.1 GPa or more and relatively high, stress can be easily transferred during expansion, and the semiconductor chips adjacent to each other can be broken successfully.

The tensile storage modulus of the die bond films 3 and 3' at 175° C. after thermal curing by heating is preferably 0.01 to 50 MPa, and more preferably 0.1 to 50 MPa. By making the tensile storage modulus at 175° C. after thermal curing by heating 0.01 to 50 MPa, generation of shear deformation at the adhering surface of the die bond films 3 and 3' with the adherend due to ultrasonic vibration and heating can be prevented even in a wire bonding step. As a result, the success rate of wire bonding can be improved. The heating condition at thermal curing of the die bond films 3 and 3' is described in detail in the latter part.

The 90° peeling adhesive power of the die bond films 3 and 3' before thermal curing to the pressure-sensitive adhesive layer 2 is preferably 0.03 to 0.25 N/25 mm tape width, and more preferably 0.04 to 0.15 N/25 mm tape width. The conditions for measuring the peeling adhesive power are a tensile speed of 300 mm/min, a pasting temperature of 40° C., and a peeling temperature of 25° C. (room temperature).

The lamination structure of the die bond films 3 and 3' are not especially limited, and examples thereof include a single layer structure of an adhesive layer and a multi-layered structure in which an adhesive layer is formed on one side or both sides of a core member. Examples of the core member include films (such as polyimide film, polyester film, polyethylene terephthalate film, polyethylene naphthalate film, and polycarbonate film); resin substrates which are reinforced with glass fiber or plastic nonwoven finer; silicon substrates; and glass substrates.

The adhesive composition constituting the die bond films 3, 3' include those in which a thermoplastic resin is used in combination with a thermosetting resin.

Examples of the above-mentioned thermosetting resin include phenol resin, amino resin, unsaturated polyester resin, epoxy resin, polyurethane resin, silicone resin, and thermosetting polyimide resin. These resins may be used alone or in combination of two or more thereof. Particularly preferable is epoxy resin, which contains ionic impurities which corrode semiconductor elements in only a small amount. As the curing agent of the epoxy resin, phenol resin is preferable.

The epoxy resin may be any epoxy resin that is ordinarily used as an adhesive composition. Examples thereof include bifunctional or polyfunctional epoxy resins such as bisphenol A type, bisphenol F type, bisphenol S type, brominated bisphenol A type, hydrogenated bisphenol A type, bisphenol AF type, biphenyl type, naphthalene type, fluorene type, phenol Novolak type, orthocresol Novolak type, tris-hydroxyphenylmethane type, and tetraphenylolethane type epoxy resins; hydantoin type epoxy resins; tris-glycicylisocyanurate type epoxy resins; and glycidylamine type epoxy resins. These may be used alone or in combination of two or more thereof. Among these epoxy resins, particularly preferable are Novolak type epoxy resin, biphenyl type epoxy resin, tris-hydroxyphenylmethane type epoxy resin, and tetraphenylolethane type epoxy resin, since these epoxy resins are rich in reactivity with phenol resin as an agent for curing the epoxy resin and are superior in heat resistance and so on.

The phenol resin is a resin acting as a curing agent for the epoxy resin. Examples thereof include Novolak type phenol resins such as phenol Novolak resin, phenol aralkyl resin, cresol Novolak resin, tert-butylphenol Novolak resin and nonylphenol Novolak resin; resol type phenol resins; and polyoxystyrenes such as poly(p-oxystyrene). These may be used alone or in combination of two or more thereof. Among these phenol resins, phenol Novolak resin and phenol aralkyl resin are particularly preferable, since the connection reliability of the semiconductor device can be improved.

About the blend ratio between the epoxy resin and the phenol resin, for example, the phenol resin is blended with the epoxy resin in such a manner that the hydroxyl groups in the phenol resin is preferably from 0.5 to 2.0 equivalents, more preferably from 0.8 to 1.2 equivalents per equivalent of the epoxy groups in the epoxy resin component. If the blend ratio between the two is out of the range, curing reaction therebetween does not advance sufficiently so that properties of the cured epoxy resin easily deteriorate.

Examples of the thermoplastic resin include a natural rubber, a butyl rubber, an isoprene rubber, a chloroprene rubber, and ethylene-vinyl acetate copolymer, an ethylene-acrylic acid copolymer, an ethylene-acrylic ester copolymer, a polybutadiene resin, a polycarbonate resin, a thermoplastic polyimide resin, a polyamide resin such as 6-nylon or 6,6-nylon, a phenoxy resin, an acrylic resin, a saturated polyester resin such as PET or PBT, a polyamideimide resin, and a fluororesin. These thermoplastic resins can be used alone or two types or more can be used together. Among these thermoplastic resins, an acrylic resin is especially preferable because it has a small amount of ionic impurities, high heat resistance, and can secure reliability of a semiconductor element.

The acrylic resin is not especially limited, and examples thereof include a polymer (an acrylic copolymer) that is constituted from one type or two types or more of acrylic acid ester or methacrylic acid esters having linear or branched alkyl groups having 30 or less carbon atoms, especially 4 to 18 carbon atoms. Examples of the alkyl group include a methyl group, an ethyl group, a propyl group, an isopropyl group, an n-butyl group, a t-butyl group, an isobutyl group, an amyl group, an isoamyl group, a hexyl group, a heptyl group, a cyclohexyl group, a 2-ethylhexyl group, an octyl group, an isooctyl group, a nonyl group, an isononyl group, a decyl group, an isodecyl group, an undecyl group, a lauryl group, a tridecyl group, a tetradecyl group, a stearyl group, an octadecyl group, and a dodecyl group.

Other monomers that form the polymer are not especially limited, and examples thereof include carboxyl group-containing monomers such as acrylic acid, methacrylic acid, carboxyethyl acrylate, carboxypentyl acrylate, itaconic acid, maleic acid, fumaric acid, and crotonic acid, acid anhydride monomers such as maleic anhydride and itaconic anhydride, hydroxyl group-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate, and (4-hydroxymethylcyclohexyl)-methylacrylate, sulfonic acid group-containing monomers such as styrene sulfonate, allyl sulfonate, 2-(meth)acrylamide-2-methylpropane sulfonic acid, (meth)acrylamidepropane sulfonic acid, sulfopropyl(meth)acrylate, and (meth)acryloyloxynaphthalene sulfonic acid, and phosphate group-containing monomers such as 2-hydroyethylacryloyl phosphate.

The mixing ratio of the thermosetting resin is not especially limited as long as it is a ratio at which a thermosetting function of the die bond films 3 and 3' can be exhibited when the films are heated under predetermined conditions. However, it is preferably 5 to 60% by weight and more preferably 10 to 50% by weight.

In order to crosslink the die bond film 3, 3' of the present invention to some extent in advance, it is preferable to add, as a crosslinking agent, a polyfunctional compound which reacts with functional groups of molecular chain terminals of the above-mentioned polymer to the materials used when the sheet 12 is produced. In this way, the adhesive property of the sheet at high temperatures is improved so as to improve the heat resistance.

The crosslinking agent may be one known in the prior art. Particularly preferable are polyisocyanate compounds, such as tolylene diisocyanate, diphenylmethane diisocyanate, p-phenylene diisocyanate, 1,5-naphthalene diisocyanate, and adducts of polyhydric alcohol and diisocyanate. The amount of the crosslinking agent to be added is preferably set to 0.05 to 7 parts by weight for 100 parts by weight of the above-mentioned polymer. If the amount of the crosslinking agent to be added is more than 7 parts by weight, the adhesive force is unfavorably lowered. On the other hand, if the adding amount is less than 0.05 part by weight, the cohesive force is unfavorably insufficient. A different polyfunctional compound, such as an epoxy resin, together with the polyisocyanate compound may be incorporated if necessary.

Fillers other than the conductive particles can be appropriately compounded in the die bond films 3 and 3' according to the intended use. The compounding of the filler enables adjustment of the modulus, and the like. Examples of the fillers include inorganic fillers and organic fillers. Examples of the filler include an inorganic filler and an organic filler. However, an inorganic filler is preferable from the viewpoint of improving handling property, improving thermal conductivity, adjusting melt viscosity, and giving thixotropy. The inorganic filler is not especially limited, and examples thereof include aluminum hydroxide, magnesium hydroxide, calcium carbonate, magnesium carbonate, calcium silicate, magnesium silicate, calcium oxide, magnesium oxide, aluminum oxide, aluminum nitride, aluminum borate whiskers, boron nitride, crystalline silica, and amorphous silica. These can be used alone or two types or more can be used together.

Additives other than the conductive particles and the fillers can be appropriately compounded in the die bond films 3 and 3' as necessary. Examples thereof include a flame retardant, a silane coupling agent, and an ion trapping agent. Examples of the flame retardant include antimony trioxide, antimony pentaoxide, and brominated epoxy resin. These may be used alone or in combination of two or more thereof. Examples of the silane coupling agent include β-(3,4-epoxycyclohexyl)ethyltrimethoxysilane, γ-glycidoxypropyltrimethoxysilane, and γ-glycidoxypropylmethyldiethoxysilane. These may be used alone or in combination of two or more thereof. Examples of the ion trapping agent include hydrotalcite and bismuth hydroxide. These may be used alone or in combination of two or more thereof.

The thickness (total thickness in the case of a laminated body) of the die bond films 3 and 3' is not especially limited. However, it is preferably 5 to 100 μm, more preferably 5 to 60 μm, and further preferably 5 to 30 μm from the viewpoint of compatibility of cracking prevention of the chip cut surface and fixing and holding by the adhesive layer.

The dicing die bond films 10 and 12 can have the antistatic function also to the base 1 and to the pressure-sensitive adhesive layer for preventing generation of static electricity at adhesion, peeling, and the like, and for preventing breakage of a circuit due to electrification of a semiconductor wafer, or the like caused by static electricity. The antistatic function can be given by an appropriate method such as a method of adding an antistatic agent or a conductive substance to the base 1 or the pressure-sensitive adhesive layer 2 or a method of providing a conductive layer made of a charge transfer complex, a metal film, or the like to the base 1. A method is preferable with which impurity ions that have a possibility of deteriorating the semiconductor wafer hardly generate. Examples of the conductive substance (conductive filler) compounded for the purpose of giving conductivity or improving thermal conductivity include a spherical, needle-shaped, or flake-shaped metal powder of silver, aluminum, gold, copper, nickel, a conductive alloy, or the like, a metal oxide such as alumina, amorphous carbon black, and graphite.

The die bond films 3, 3' of the dicing die bond films 10, 12 are preferably protected by a separator (not shown). The separator has a function as a protecting material that protects the die bond films 3, 3' until they are practically used. Further, the separator can be used as a supporting base material when transferring the die bond films 3, 3' to the pressure-sensitive adhesive layer 2. The separator is peeled when pasting a workpiece onto the die bond films 3, 3' of the dicing die bond film. Polyethylenetelephthalate (PET), polyethylene, polypropylene, a plastic film, a paper, etc. whose surface is coated with a peeling agent such as a fluorine based peeling agent and a long chain alkylacrylate based peeling agent can be also used as the separator.

The dicing die bond films 10, 11 according to the present embodiment are produced, for example, by the following procedure. First, the base material 1 can be formed by a conventionally known film-forming method. The film-forming method includes, for example, a calendar film-forming method, a casting method in an organic solvent, an inflation extrusion method in a closed system, a T-die extrusion method, a co-extrusion method, and a dry lamination method.

Next, a pressure-sensitive adhesive composition solution is applied on the base material 1 to form a coated film and the coated film is dried under predetermined conditions (optionally crosslinked with heating) to form the pressure-sensitive adhesive layer 2. Examples of the application method include, but are not limited to, roll coating, screen coating and gravure coating methods. Drying is conducted under the drying conditions, for example, the drying temperature within a range from 80 to 150° C. and the drying time within a range from 0.5 to 5 minutes. The pressure-sensitive adhesive layer 2 may also be formed by applying a pressure-sensitive adhesive composition on a separator to form a coated film and drying the coated film under the drying conditions. Then, the pressure-sensitive adhesive layer 2 is laminated on the base material 1 together with the separator. Thus, the dicing film 11 is produced.

The die bond films 3, 3' are produced, for example, by the following procedure.

First, an adhesive composition solution as a material for forming the dicing die bond films 3, 3' is produced. As described above, the adhesive composition solution is blended with the adhesive composition, the conductive particles, and various additives.

Next, the adhesive composition solution is applied on a substrate separator to form a coated film having a predetermined thickness and the coated film is dried under predetermined conditions to form an adhesive layer. Examples of the application method include, but are not limited to, roll coating, screen coating and gravure coating methods. Drying is conducted under the drying conditions, for example, the drying temperature within a range from 70 to 160° C. and the drying time within a range from 1 to 5 minutes. An adhesive layer may also be formed by applying a pressure-sensitive adhesive composition solution on a separator to form a coated film and drying the coated film under the drying conditions. On the substrate separator, the adhesive layer is layered together with a separator.

Subsequently, each separator is peeled from the dicing film 11 and the adhesive layer and both are laminated to each other so that the adhesive layer and the pressure-sensitive adhesive layer serve as a laminating surface. Lamination is conducted, for example, by contact bonding. At this time, the lamination temperature is not particularly limited and is, for example, preferably from 30 to 50° C., and more preferably from 35 to 45° C. The linear pressure is not particularly limited and is, for example, from 0.1 to 20 kgf/cm, and more preferably from 1 to 10 kgf/cm. Then, the substrate separator on the adhesive layer is peeled to obtain the dicing die bond film according to the present embodiment.

(Method of Manufacturing Semiconductor Device)

Next, a method of manufacturing a semiconductor device using the dicing die bond film 12 is explained by referring to FIGS. 3 to 6.

Figure 3:
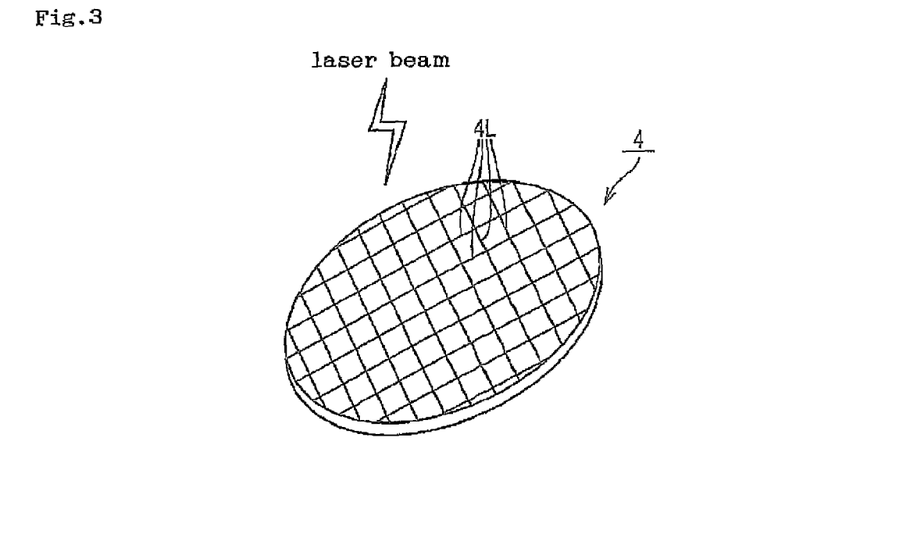
FIG. 3 is a schematic sectional view for explaining one method of manufacturing a semiconductor device according to the present embodiment.

FIGS. 3 to 6 are schematic sectional views for explaining one method of manufacturing a semiconductor device according to the present embodiment. First, as shown in FIG. 3, a pre-treatment is performed of forming a modified region on a scheduled dividing line 4L of a semiconductor wafer 4 by irradiating the semiconductor wafer 4 with a laser beam (a pre-treatment step). The present method is a method of forming a reformed region inside the semiconductor wafer by ablation caused by multi-photon absorption by focusing condensing points on the inside of the semiconductor wafer and irradiating the semiconductor water with a laser beam along the lattice-shaped scheduled dividing lines. A semiconductor wafer having a thickness of 1 to 500 μm can be used, for example. The irradiation conditions of the laser beam are appropriately adjusted within the following ranges.

<Laser Beam Irradiation Conditions>

(A) Laser Beam

Laser Beam Source Semiconductor laser excitation Nd:YAG laser

Wavelength 1064 nm

Sectional Area of Laser Spot $3.14 \times 10^{-8}$ cm$^2$

Laser Oscillation Form Q switch pulse

Repetition Frequency 100 kHz or less

Pulse Width 1 μs or less

Output 1 mJ or less

Quality of Laser Beam TEM00

Polarization Characteristic Linear polarization (B) Beam Collecting Lens

Magnification 100 times or less

NA 0.55

Transmittance to Laser Beam Wavelength 100% or less (C) Movement Speed of the Stage on which Semiconductor Substrate is Loaded 280 Mm/Sec or Less A detailed explanation of the method of forming a reformed region on the scheduled dividing lines 4L by irradiating the semiconductor wafer with a laser beam is omitted because it is specifically described in Japanese Patent No. 3408805 and Japanese Patent Application Laid-Open No. 2003-338567.

Figure 4:
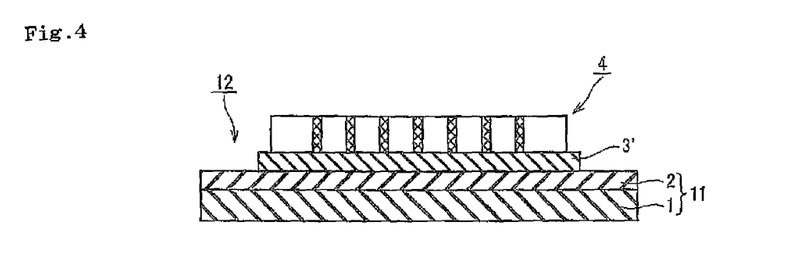
FIG. 4 is a schematic sectional view for explaining the method of manufacturing a semiconductor device according to the present embodiment.
Figure 5:
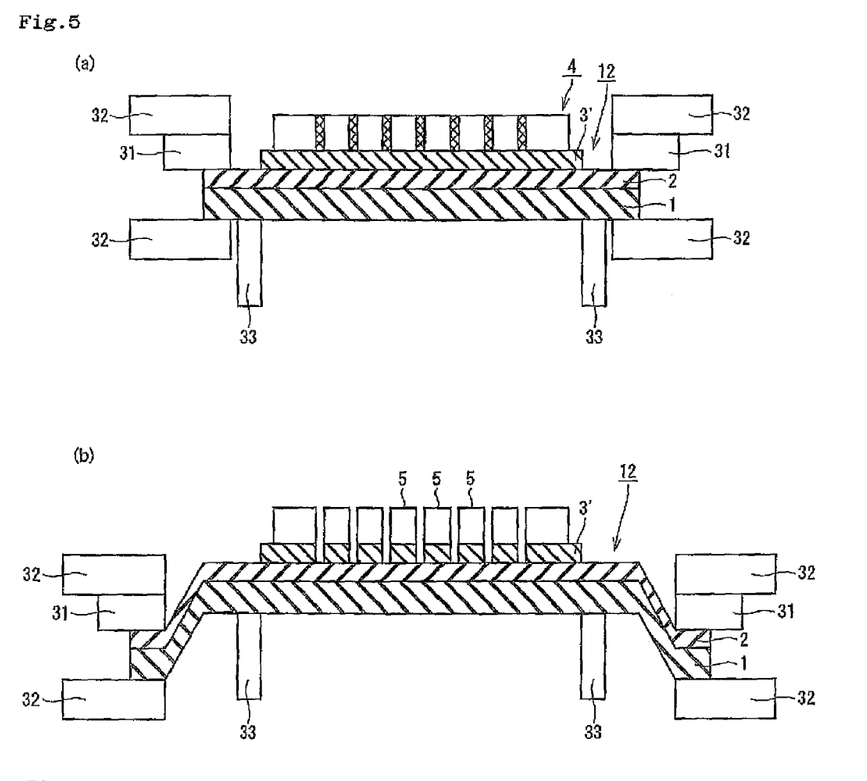
FIGS. 5A and 5B are schematic sectional views for explaining the method of manufacturing a semiconductor device according to the present embodiment.

Next, as shown in FIG. 4, the semiconductor wafer 4 subjected to the pre-treatment is pressure-bonded onto the die bond film 3' of the dicing die bond film 12, and the laminate fixed by adhering and holding (a mounting step). This step is performed while pressing the wafer with a pressing means such as a press bonding roll. The bonding temperature during mounting is not especially limited, however, it is preferably in the range of 40 to 80° C. This is because warping of the semiconductor wafer 4 can be effectively prevented and the influence of expansion and contraction of the dicing die bond film can be reduced.

Next, the semiconductor chip 5 is formed by applying a tensile force to the dicing die bond film 12 and breaking the semiconductor wafer 4 and the die bond film 3' (the expanding step). In this step, a wafer expander on the market can be used, for example. Specifically, a dicing ring 31 is bonded onto the peripheral part of a pressure-sensitive adhesive layer 2 of the dicing die bond film 12 on which the semiconductor wafer 4 is bonded, and then it is fixed onto a wafer expander 32 as shown in FIG. 5A. Next, a tensile force is applied to the dicing die bond film 12 by raising a push-up part 33 as shown in FIG. 5B.

The expansion speed (the rising speed of the push-up part) is preferably 1 to 400 mm/sec, and more preferably 50 to 400 mm/sec. With the expansion speed being 1 mm/sec or more, the semiconductor wafer 4 and the die bond film 3' can be nearly simultaneously and easily broken. With the expansion speed being 400 mm/sec or less, the dicing film 11 can be prevented from being broken.

The expansion amount (the amount of raise of the push-up part) is preferably 5 to 50 mm, more preferably 5 to 40 mm, and especially preferably 5 to 30 mm. With the expansion amount being 5 mm or more, breakage of the semiconductor wafer 4 and the die bond film 3 can be made easy. With the expansion amount being 50 mm or less, the dicing film 11 can be prevented from being broken.

The expansion temperature may be adjusted within −50 to 100° C. as necessary. However, it is preferably −20 to 30° C. and more preferably −10 to 25° C. in the present invention. A lower expansion temperature is preferable in respect of preventing the lowering of the yield due to insufficient breakage of the die bond film, because when the temperature is low, the breaking expansion is small and the die bond film can be easily broken.

As described above, cracks can be generated in the thickness direction of the semiconductor wafer 4 with the reformed region of the semiconductor wafer 4 as a starting point, the die bond film 3' that is closely attached to the semiconductor wafer 4 can be broken by applying a tensile force to the dicing die bond film 12, and the semiconductor chip 5 with the die bond film 3' can be obtained. Especially because the tensile storage modulus of the die bond film 3' at −20° C. before thermal curing is 0.1 to 10 GPa, generation of chipping upon breaking the semiconductor wafer 4 at the modified region can be prevented.

Next, pickup of the semiconductor chip 5 is performed to peel off the semiconductor chip 5 that is adhered and fixed onto the dicing die bond film 12 (the pickup step). The method of picking up is not particularly limited, and conventionally known various methods can be adopted. Examples include a method of pushing up the individual semiconductor chip 5 from the dicing die-bonding 10 side with a needle and picking up the pushed semiconductor chip 5 with a picking-up apparatus. Because the tensile storage modulus of the die bond film 3' at −20° C. before thermal curing is 0.1 to 10 GPa, chip fly and positional deviation of the semiconductor chip 5 upon picking up the semiconductor chip 5 can be prevented.

As pickup conditions, the needle pushing speed is preferably 5 to 100 mm/sec, and more preferably 5 to 10 mm/sec. By making the needle punching speed 5 mm/sec or more, the electrostatic discharging amount is prevented from becoming large, and by making the needle punching speed 100 mm/sec or less, the electrification amount is prevented from becoming large.

Peeling electrification occurs during pickup when the semiconductor chip 5 with the die bond film 3 is peeled from the dicing film 11. However, the dicing die bond film 12 according to the present embodiment is relatively hard to cause peeling electrification because the volume resistivity is $1 \times 10^{-3}$/cm or less. As a result, breakage of the semiconductor chip 5 due to the generated static electricity can be prevented, and the reliability of the semiconductor chip 5 can be improved.

Here, the picking up is performed after radiating the pressure-sensitive adhesive layer 2 with ultraviolet rays because the pressure-sensitive adhesive layer 2 is an ultraviolet curable type pressure-sensitive adhesive layer. Accordingly, the adhesive strength of the pressure-sensitive adhesive layer 2 to the die bond film 3a decreases, and the peeling of the semiconductor chip 5 becomes easy. As a result, picking up becomes possible without damaging the semiconductor chip 5. The condition such as irradiation intensity and irradiation time when irradiating an ultraviolet ray is not particularly limited, and it may be appropriately set depending on necessity. Further, the light source as described above can be used as a light source used in the ultraviolet irradiation.

Figure 6:
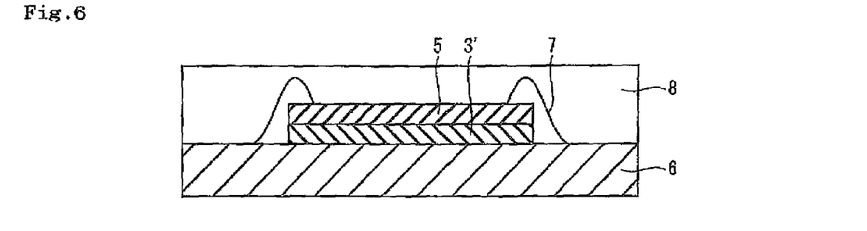
FIG. 6 is a schematic sectional view for explaining the method of manufacturing a semiconductor device according to the present embodiment.

Next, as shown in FIG. 6, the picked up semiconductor chip 5 is temporarily fixed to an adherend 6 with the die bond film 3' interposed therebetween (a fixing step). Examples of the adherend 6 include such as a lead frame, a TAB film, a substrate, and a semiconductor chip separately produced. The adherend 6 may be a deformable adherend that are easily deformed, or may be a non-deformable adherend (a semiconductor wafer, etc.) that is difficult to deform, for example.

A conventionally known substrate can be used as the substrate. Further, a metal lead frame such as a Cu lead frame and a 42 Alloy lead frame and an organic substrate composed of glass epoxy, BT (bismaleimide-triazine), and polyimide can be used as the lead frame. However, the present invention is not limited to this, and includes a circuit substrate that can be used by mounting a semiconductor element and electrically connecting with the semiconductor element.

The shear adhering strength to the adherend 6 at 25° C. during the temporary fixing of the die bond film 3' is preferably 0.2 MPa or more, and more preferably 0.2 to 10 MPa. When the shear adhering strength of the die bond film 3 is at least 0.2 MPa, shear deformation rarely occurs at the adhering surface between the die bond film 3 and the semiconductor chip 5 or the adherend 6 during the wire bonding step due to ultrasonic vibration and heating in this step. That is, the semiconductor element rarely moves due to the ultrasonic vibration during the wire bonding, and with this, the success rate of the wire bonding can be prevented from decreasing. The shear adhering strength to the adherend 6 at 175° C. during the temporary fixing of the die bond film 3' is preferably 0.01 MPa or more, and more preferably 0.01 to 5 MPa.

Next, wire bonding is performed to electrically connect a tip of a terminal part (inner lead) of the adherend 6 and an electrode pad (not shown) on the semiconductor chip 5 with a bonding wire 7 (the wire bonding step). The bonding wires 7 may be, for example, gold wires, aluminum wires, or copper wires. The temperature when the wire bonding is performed is from 80 to 250° C., preferably from 80 to 220° C. The heating time is from several seconds to several minutes. The connection of the wires is performed by using a combination of vibration energy based on ultrasonic waves with compression energy based on the application of pressure in the state that the wires are heated to a temperature in the above-mentioned range. The present step can be conducted without thermal setting of the die bond film 3a. In the process of the step, the semiconductor chip 5 and the adherend 6 are not fixed to each other by the die bond film 3a.

Next, the semiconductor chip 5 is sealed with the sealing resin 8 (the sealing step). The present step is performed by molding the sealing resin with a mold or die. The sealing resin 8 may be, for example, an epoxy resin. The heating for the resin-sealing is performed usually at 175° C. for 60 to 90 seconds. In the this invention, however, the heating is not limited to this, and may be performed, for example at 165 to 185° C. for several minutes. In such a way, the sealing resin is cured and further the semiconductor chip 5 and the adherend 6 are set to each other through the adhesive sheet 3a. In short, even if the below mentioned post-curing step, which will be detailed later, is not performed in this invention, the sticking/fixing based on the adhesive sheet 3a can be attained in the present step so that the number of the producing steps can be reduced and the term for producing the semiconductor device can be shortened.

In the post-curing step, the sealing resin 8, which is not sufficiently cured in the sealing step, is completely cured. Even if the die bond film 3a is not completely cured in the step of sealing, the die bond film 3a and sealing resin 8 can be completely cured in the present step. The heating temperature in the present step is varied dependently on the kind of the sealing resin, and is, for example, in the range of 165 to 185° C. The heating time is from about 0.5 to 8 hours.

The case of temporarily fixing the semiconductor chip 5 with the die bond film 3' to the adherend 6 and then performing the wire bonding step without completely thermally curing the die bond film 3' is explained in the above-described embodiment. However, a normal die bonding step of temporarily fixing the semiconductor chip 5 with the die bond film 3' to the adherend 6, thermally curing the die bond film 3', and then performing the wire bonding step may be performed in the present invention. In this case, the die bond film 3' after the thermal setting preferably has a shear adhering strength at 175° C. of 0.01 MPa or more, and more preferably 0.01 to 5 MPa. With the shear adhering strength at 175° C. after the thermal setting being 0.01 MPa or more, the shear deformation at the adhering surface between the die bond film 3' and the semiconductor chip 5 or the adherend 6 due to ultrasonic vibration and heating during the wire bonding step can be prevented from occurring.

The dicing die bond film of the present invention can be suitably used when laminating a plurality of semiconductor chips to carry out three-dimensional mounting. At this time, a die bond film and a spacer may be laminated between the semiconductor chips, or only a die bond film may be laminated between semiconductor chips without laminating a spacer. The mode of mounting can be appropriately changed according to the manufacturing condition and the use.

Another method of manufacturing a semiconductor device using the dicing die bond film 12 is explained referring to FIGS. 7A to 7C and FIG. 8.

Figure 7:
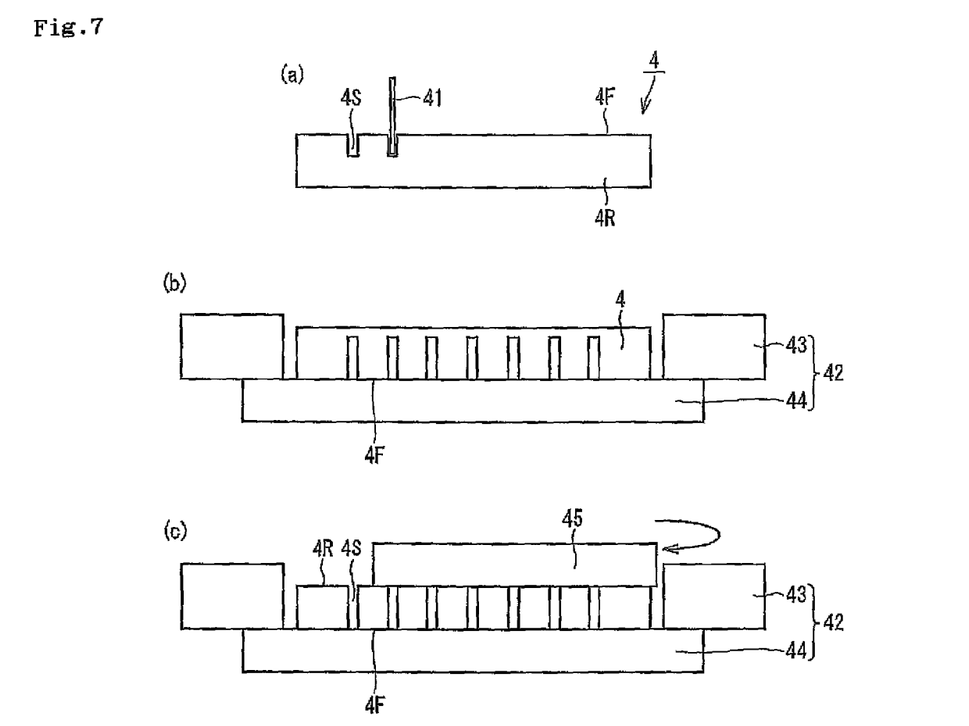
FIGS. 7A, 7B and 7C are schematic sectional views for explaining another method of manufacturing a semiconductor device according to the present embodiment.
Figure 8:
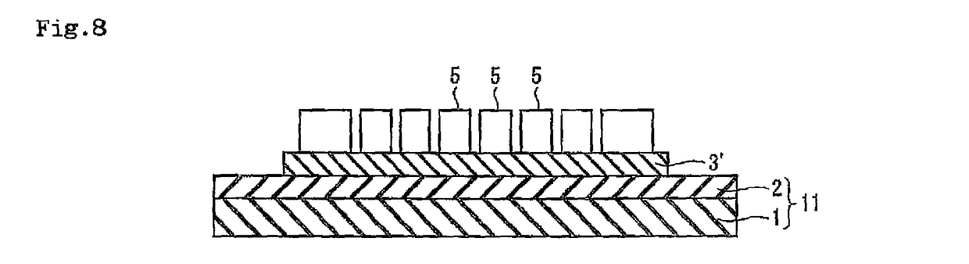
FIG. 8 is a schematic sectional view for explaining the different method of manufacturing a semiconductor device according to the present embodiment.

FIGS. 7 and 8 are schematic sectional views for explaining another method of manufacturing a semiconductor device according to the present embodiment. First, a groove 4S that does not reach backside 4R is formed on a surface 4F of the semiconductor wafer 4 with a rotary blade 41 as shown in FIG. 7A. The semiconductor wafer 4 is supported by a supporting base that is not shown during the formation of the groove 4S. The depth of the groove 4S can be appropriately set depending on the thickness of the semiconductor wafer 4 and the expansion condition.

As shown in FIG. 7B, a protective member 42 is made to support the semiconductor wafer 4 so that a surface 4F comes into contact with the protective member 42. The protective member 42 has a ring-shaped frame 43 having an opening in the center and a protective tape 44 that is pasted to the backside of the frame 43 and that covers the opening of the frame 43, and the protective tape 44 supports the semiconductor wafer 4 with its adhesive power.

The support base that is used during the formation of grooves 4S is peeled. After that, as shown in FIG. 7C, the grooves 4S are exposed from the backside 4R by performing backside grinding with a grinding stone (a groove exposing step). Then, the dicing die bond film 12 is pasted to the surface 4F of the semiconductor wafer 4 where the grooves 4S are exposed (a pasting step). A conventionally known tape pasting apparatus can be used for pasting the protective tape 44 and the dicing die bond film 12 to the semiconductor wafer 4, and a conventionally known grinding apparatus can be used for the backside grinding.

As shown in FIG. 8, the semiconductor wafer 4 with the exposed grooves 4S is pressure-bonded onto the die bond film 3' of the dicing die bond film 12 and the laminate is fixed by adhering and holding (a mounting step). After that, the protective sheet 34 is peeled, and an expanding step is performed. The expanding step can be performed in the same manner as in the case where the modified region is formed on the scheduled dividing line 4L by irradiation with a laser beam.

By applying a tensile force to the dicing die bond film 12, the die bond film 3' can be broken at the position that corresponds to the grooves 4S, and the semiconductor chip 5 with the die bond film 3' can be obtained.

Explanation of the subsequent steps is omitted because they are the same as the case where the modified region is formed on the scheduled dividing line 4L by irradiation with a laser beam.

The method of dicing a semiconductor wafer in the present invention is not limited to the above-described embodiment, and a so-called full cut cutting method may be adopted in which cutting is performed into the dicing die bond film 10 by a blade. The dicing die bond film of the present invention can be used also in the method of manufacturing a semiconductor device by a full cut method.

EXAMPLES

Below, preferred examples of the present invention are explained in detail. However, materials, addition amounts, and the like described in these examples are not intended to limit the scope of the present invention, and are only examples for explanation as long as there is no description of limitation in particular. In the following, "part (s)" means "part (s) by weight."

Example 1

An adhesive composition solution having a concentration of 23% by weight was obtained by dissolving the following (a) to (g) in methylethylketone.

(a) 100 parts of an acrylic ester polymer containing ethyl acrylate-methyl methacrylate as a main component (Paracron W-197CM manufactured by Negami Chemical Industries Co., Ltd.)

(b) 228 parts of an epoxy resin 1 (Epicoat 1004 manufactured by Japan Epoxy Resin Co., Ltd.)

(c) 206 parts of an epoxy resin 2 (Epicoat 827 manufactured by Japan Epoxy Resin Co., Ltd.)

(d) 466 parts of a phenol resin (Milex XLC-4L manufactured by Mitsui Chemicals, Inc.)

(e) 400 parts of a spherical copper powder 1 (SF-Cu manufactured by Nippon Atomized Metal Powder Corporation, average particle size 10 µm)

(f) 267 parts of a spherical copper powder 2 (SF-Cu manufactured by Nippon Atomized Metal Powder Corporation, average particle size 6 µm)

(g) 3 parts of a curing catalyst (C11-Z manufactured by Shikoku Chemicals Corporation)

A die bond film A having a thickness of 20 µm was produced by applying this adhesive composition solution onto a releasing treatment film (a peeling liner) made of a polyethylene terephthalate film and having a thickness of 38 µm subjected to a silicone releasing treatment and drying the film at 130° C. for 2 minutes.

Example 2

In Example 2, a die bond film B according to the present example was produced in the same manner as in Example 1 except the spherical copper powder 1 of (e) and the spherical copper powder 2 of (f) were changed to 367 parts of a spherical silver powder 1 (SFR-AG manufactured by Tokuriki Chemical Research Co., Ltd., average particle size 5 µm) and 300 parts of a spherical silver powder 2 (AgC-156I manufactured by Fukuda Metal Foil & Powder Co., Ltd., average particle size 3 µm).

Example 3

In Example 3, a die bond film C according to the present example was produced in the same manner as in Example 1 except the spherical copper powder 1 of (e) and the spherical copper powder 2 of (f) were changed to 2502 parts of a spherical copper powder 1 (Cu-HWQ manufactured by Fukuda Metal Foil & Powder Co., Ltd., average particle size 5 μm) and 1500 parts of a spherical copper powder 2 (Cu-HWQ manufactured by Fukuda Metal Foil & Powder Co., Ltd., average particle size 1.5 μm).

Comparative Example 1

In Comparative Example 1, a die bond film D according to the present example was produced in the same manner as in Example 1 except the spherical copper powder 1 of (e) was changed to 667 parts of a spherical copper powder (SF-Cu manufactured by Nippon Atomized Metal Powder Corporation, average particle size 6 μm) and the spherical copper powder 2 of (f) was not added.

Comparative Example 2

In Comparative Example 2, a die bond film E according to the present example was produced in the same manner as in Example 1 except the added amount of the spherical copper powder 1 of (e) was changed to 61 parts and the added amount of the spherical copper powder 2 of (f) was changed to 50 parts.

Comparative Example 3

In Comparative Example 3, a die bond film F according to the present example was produced in the same manner as in Example 1 except the added amount of the spherical copper powder 1 of (e) was changed to 5004 parts and the added amount of the spherical copper powder 2 of (f) was changed to 4000 parts.

(Measurement of Volume Resistivity)

The measurement of the volume resistivity was performed on the die bond films A to F by a four-point probe method according to JIS K 7194 using a resistivity meter (Loresta MP MCP-T350 manufactured by Mitsubishi Chemical Corporation). The result is shown in Table 1.

(Measurement of Peeling Electrification Amount)

Dicing die bond films A to F were formed by pasting a dicing film to each of the die bond films A to F. A dicing film (DU-400SE manufactured by Nitto Denko Corporation) was used, which is a laminate in which a pressure-sensitive adhesive layer (an acrylic pressure-sensitive adhesive layer having a thickness of 5 μm) is laminated on a base (a polyolefin film having a thickness of 100 μm). Then, a silicon wafer having a thickness of 75 μm was pasted to each of the dicing die bond films A to F at 40° C., and dicing was performed so that the size of the diced pieces became 5 mm×5 mm under the following conditions. The semiconductor chip was picked up, and the chip electrification amount right after peeling was measured using an electrification amount measurement apparatus (ELECTROSTATIC VOLTMETER MODEL 520 manufactured by TREK, Inc.) Specifically, 10 measurements were performed in an atmosphere of room temperature (25° C.) and a humidity of 50%, and the average value was calculated as the electrification amount. As a result of the measurement, an electrification amount was evaluated as ○ when it was 1.0 kV or less, and x when it exceeded 1.0 kV. The result of the measurement and the evaluation are shown in Table 1. The pickup conditions were as follows.

<Dicing Conditions>
Dicing apparatus: DISCO DFD-6361 manufactured by DISCO Corporation
Dicing speed: 50 mm/sec
Dicing blade:
Z1; NBC-ZH2030-SE27HDD manufactured by DISCO Corporation
Z2; NBC-ZH1030-SE27HBB manufactured by DISCO Corporation
Dicing blade rotation speed:
Z1; 40,000 rpm
Z2; 45,000 rpm
Cutting method: step cut
Dicing tape cut depth: 20 μm
Chip size: 5 mm×5 mm
<Pickup Conditions>
Pickup apparatus: SPA-300 manufactured by Shinkawa Ltd.
Number of needles: 5 needles
Needle pushing speed: 10 mm/sec
Expand: pulling down distance: 3 mm
Needle pushing distance: 400 μm
(Measurement of Tensile Storage Modulus at −20° C. Before Thermal Curing)

The die bond films A to F were cut into rectangular measurement pieces of 200 μm thick and 10 mm wide. The tensile storage modulus at −50 to 300° C. was measured under conditions of a frequency of 1 Hz and a temperature rise rate of 10° C./min using a solid viscoelasticity measurement apparatus (RSA III manufactured by Rheometric Scientific FE, Ltd.). The measured values at −20° C. are shown in Table 1.
(Measurement of Tensile Storage Modulus at 175° C. After Thermal Curing)

A heat treatment was performed on the die bond films A to F for 1 hour under a condition of 120° C. After that, the die bond films A to F were cut into rectangular measurement pieces 200 μm thick and 10 mm wide. The tensile storage modulus at −50 to 300° C. was measured under conditions of a frequency of 1 Hz and a temperature rise rate of 10° C./min using a solid viscoelasticity measurement apparatus (RSA III manufactured by Rheometric Scientific FE, Ltd.). The measured values at 175° C. are shown in Table 1.
(Confirmation of Breakage)
<Case in which a Step (Step 1) was Adopted in which a Reformed Region was Formed on the Scheduled Dividing Lines by Irradiating the Semiconductor Wafer with a Laser Beam>

A reformed region was formed in the interior of the semiconductor wafer by focusing condensing points in the interior of the semiconductor wafer and irradiating the semiconductor wafer with a laser beam at the surface of the semiconductor wafer along the lattice-shaped (10 mm×10 mm) scheduled dividing lines using ML300-Integration manufactured by Tokyo Seimitsu Co., Ltd. as a laser beam machining apparatus. A silicon wafer (thickness: 75 μm, outer diameter: 12 inches) was used as the semiconductor wafer. The irradiation conditions of the laser beam were as follows.
<Laser Beam Irradiation Conditions>
(A) Laser Beam
Laser Beam Source Semiconductor laser excitation Nd:YAG laser
Wavelength 1064 nm
Sectional Area of Laser Spot $3.14 \times 10^{-8}$ cm$^2$
Laser Oscillation Form Q switch pulse
Repetition Frequency 100 kHz
Pulse Width 30 ns
Output 20 μT/pulse Quality of Laser Beam TEM00 40
Polarization Characteristic Linear polarization
(B) Beam Collecting Lens
Magnification 50 times
NA 0.55
Transmittance to Laser Beam Wavelength 60% between the semiconductor chip and the BGA substrate or not was observed with an ultrasonic microscope. As a result of the observation, the samples were evaluated as ○ when the number of samples in which peeling occurred was 3 or less and x when the number was 4 or more. The result is shown in Table 1.

TABLE 1

|  | VOLUME RESISTIVITY | ELECTRIFICATION AMOUNT | MODULUS BEFORE THERMAL CURING | MODULUS AFTER THERMAL CURING | BREAKING PROPERTY | | MOISTURE ABSORPTION |
|---|---|---|---|---|---|---|---|
|  | ($\times 10^{-3}$ $\Omega \cdot$ cm) | (V) | (GPa) | (GPa) | STEP 1 | STEP 2 | RELIABILITY |
| Example 1 | 0.31 | ○ | 5.53 | 24 | ○ | ○ | ○ |
| Example 2 | 0.06 | ○ | 4.41 | 18.8 | ○ | ○ | ○ |
| Example 3 | 0.027 | ○ | 7.95 | 31 | ○ | ○ | ○ |
| Comparative Example 1 | 24 | ○ | 4.6 | 17.4 | ○ | ○ | ○ |
| Comparative Example 2 | 98 | x | 0.89 | 0.09 | x | ○ | x |
| Comparative Example 3 | 0.011 | ○ | 11.3 | 35 | x | x | ○ |

(C) Movement Speed of the Stage on which Semiconductor Substrate is Loaded 100 Mm/Sec A breaking test was performed on each of the die bond films A to F after bonding the semiconductor wafer on which the pretreatment by a laser beam was performed. The conditions of expansion in the breaking test were room temperature (25° C.) an expansion speed of 300 mm/sec., and an expansion amount of 30 mm. As a result of the breaking test, the case in which there was no occurrence of insufficient breakage is regarded as good, and the case in which there were places of insufficient breakage is regarded as poor. The result is shown in Table 1.

<Case in which a Step (Step 2) was Adopted in which Grooves were Formed on the Surface of the Semiconductor Wafer and then Backside Grinding was Performed>

Lattice-shaped (10 mm×10 mm) cut grooves were formed on the semiconductor wafer (thickness 500 μm) by blade dicing. The depth of the cut grooves was 100 μm.

Next, divided individual semiconductor chips (10 mm×10 mm×75 μm) were obtained by protecting the surface of the semiconductor wafer with a protecting tape and performing backside grinding until the thickness reached 75 μm. This semiconductor chip was bonded onto each of the die bond films A to F, and then the breaking test was performed. The conditions of expansion in the breaking test were room temperature (25° C.), an expansion speed of 300 mm/sec, and an expansion amount of 30 mm. As a result of the breaking test, the case in which there was no occurrence of insufficient breakage is regarded as good, and the case in which there were places of insufficient breakage is regarded as poor, similarly to the case of step 1. The result is shown in Table 1.

(Moisture Absorption Reliability)

Each of the die bond films A to F was pasted onto a semiconductor chip of 5 mm square under a condition of 40° C., and the resultant was mounted to a BGA (Ball Grid Array) substrate under conditions of 120° C., 0.1 MPa, and 1 second. For each of the die bond films A to F, 9 pieces of the samples were prepared. A heat treatment was performed on the sample for 10 hours at 100° C., and the sample was sealed using a sealing resin (GE-100 manufactured by Nitto Denko Corporation). Then, the sample was left under an atmosphere of 60° C. and 80% RH for 168 hours. After that, the sample was passed through an IR reflow furnace whose temperature was set to maintain a temperature of 260° C. or more for 30 seconds, and whether any peeling is generated at the interface

What is claimed is:

1. A dicing die bond film comprising a dicing film and a thermosetting type die bond film provided thereon, wherein
    the thermosetting type die bond film contains conductive particles,
    the volume resistivity of the thermosetting type die bond film is $1 \times 10^{-6}$ $\Omega \cdot$cm or more and $1 \times 10^{-3}$ $\Omega \cdot$cm or less,
    the tensile storage modulus of the thermosetting type die bond film at −20° C. before thermal curing is 0.1 to 10 GPa,
    the conductive particles include first and second conductive particles having different average particle sizes,
    the first conductive particles have an average particle size of 0.01 μm or more and 5 μm or less and the second conductive particles have an average particle size of 1 μm or more and 10 μm or less, and
    the first and second conductive particles are mixed at a weight ratio in the range of 1:9 to 4:6.

2. The dicing die bond film according to claim 1, wherein the content of the conductive particles is 20 to 90 parts by weight relative to 100 parts by weight of an organic component of the thermosetting type die bond film.

3. The dicing die bond film according to claim 1, wherein a semiconductor chip with a die bond film is formed by forming a modified region on a semiconductor wafer by irradiating the semiconductor wafer with a laser beam, pasting the semiconductor wafer to the dicing die bond film, and breaking the semiconductor wafer at the modified region and simultaneously breaking the thermosetting type die bond film that configures the dicing die bond film at a position that corresponds to the modified region by applying a tensile force to the dicing die bond film, the obtained semiconductor chip with the die bond film is peeled from the dicing film, and the peeled semiconductor chip with the die bond film is used in a method of fixing the peeled semiconductor chip with the die bond film to an adherend with the die bond film interposed therebetween.

4. The dicing die bond film according to claim 1, wherein a semiconductor chip with a die bond film is formed by forming grooves on a surface of a semiconductor wafer, exposing the grooves by performing backside grinding, pasting the dicing die bond film to the surface of the semiconductor wafer where the grooves are exposed, and breaking the thermosetting type die bond film that configures the dicing die bond film at a position that corresponds to the grooves by applying a tensile force to the dicing die bond film, the obtained semiconductor chip with the die bond film is peeled from the dicing film, and the peeled semiconductor chip with the die bond film is used in a method of fixing the peeled semiconductor chip to an adherend with the die bond film interposed therebetween.

5. The dicing die bond film according to claim 1, wherein the conductive particles are of at least one kind selected from the group consisting of nickel particles, copper particles, silver particles, aluminum particles, gold particles, stainless steel particles, carbon black, carbon nanotubes, metal particles obtained by plating a surface of a metal with another metal, and resin particles of which surface is coated with a metal.

6. The dicing die bond film according to claim 1 wherein the thermosetting type die bond film contains an acrylic resin as a thermoplastic resin.

7. The dicing die bond film according to claim 1, wherein the first and second conductive particles collectively have an average particle size of 3.7 µm or more and 10 µm or less.

* * * * *